US006675035B1

United States Patent
Grable et al.

(10) Patent No.: US 6,675,035 B1
(45) Date of Patent: *Jan. 6, 2004

(54) PHANTOM FOR OPTICAL AND MAGNETIC RESONANCE IMAGING QUALITY CONTROL

(75) Inventors: Richard J. Grable, Plantation Acres, FL (US); Steve Ponder, Coral Springs, FL (US); Steve Gardner, Margate, FL (US); Paul Jackewicz, Jupiter, FL (US); Jerry Porter, Fort Lauderdale, FL (US)

(73) Assignee: Imaging Diagnostic Systems, Inc., Plantation, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 200 days.

(21) Appl. No.: 09/096,521

(22) Filed: Jun. 12, 1998

Related U.S. Application Data

(60) Provisional application No. 60/050,305, filed on Jun. 20, 1997.

(51) Int. Cl.$^7$ ............................................. A61B 5/055
(52) U.S. Cl. ..................... 600/411; 600/476; 356/337; 356/432
(58) Field of Search ................................. 600/407, 473, 600/476, 410, 411, 427; 378/37; 356/337, 432

(56) References Cited

U.S. PATENT DOCUMENTS

| | | | |
|---|---|---|---|
| 4,551,678 A | | 11/1985 | Morgan et al. |
| 4,649,275 A | * | 3/1987 | Nelson et al. ............... 600/476 |
| 4,655,716 A | | 4/1987 | Hoevel |
| 4,729,892 A | | 3/1988 | Beall |
| 4,867,686 A | | 9/1989 | Goldstein |
| 5,273,435 A | | 12/1993 | Jacobson |
| 5,312,755 A | | 5/1994 | Madsen et al. |
| 5,719,916 A | * | 2/1998 | Nelson et al. ............... 378/207 |
| 6,026,315 A | * | 2/2000 | Lenz et al. .................. 600/414 |

FOREIGN PATENT DOCUMENTS

| | | | | |
|---|---|---|---|---|
| WO | WO 96/20638 | * | 7/1996 | ................. 600/473 |
| WO | WO 97/36619 | * | 10/1997 | |

* cited by examiner

*Primary Examiner*—Ruth S. Smith
(74) *Attorney, Agent, or Firm*—Shlesinger, Arkwright & Garvey LLP

(57) ABSTRACT

A breast-shaped phantom for optical imaging comprises a cup in the shape of a human breast in its natural pendant position and a filler occupying the volume of the cup. The cup forms an outer skin of the phantom with a thickness similar to human skin and with optical transparency at selected optical wavelengths similar to human skin. The filler material has optical scattering and absorption characteristics similar to human breast tissue.

A method for making the phantom is also disclosed.

18 Claims, 4 Drawing Sheets

PHANTOM FOR OPTICAL AND MAGNETIC RESONANCE IMAGING QUALITY CONTROL

RELATED APPLICATION

This is a nonprovisional application of Provisional Application Serial No. 60/050,305, filed Jun. 20, 1997.

FIELD OF THE INVENTION

The present invention relates generally to phantoms for use in optical and magnetic resonance imaging quality control.

BACKGROUND OF THE INVENTION

Medical optical imaging is an emerging medical imaging technology. As part of the development of imaging modalities, objects are developed that can be used to test the medical imaging device without the necessity of in vivo scanning. A phantom is a test object that simulates some aspect of the anatomy of interest. These objects are commonly called "test phantoms" or simply "phantoms." In traditional x-ray imaging the phantoms can be as simple as a step-wise increase in thickness of material to simulate higher density. This style phantom is commonly called a step-wedge phantom. In x-ray computed tomography, a phantom filled with water and with circular, cylindrical, or ellipsoidal inclusions is used and one commonly used phantom is referred to as a Shepp-Logan phantom. In x-ray mammography, a standardized mammography phantom is used for federally mandated quality control programs. A good breast phantom permits objective rather than subjective analysis and should be sensitive to small changes in mammographic image quality.

The non-homogeneous nature of breast tissue is difficult to replicate in a medical optical imaging phantom. The refractive index of homogenous materials rules out their use unless their optical properties are modified in some manner. A phantom that can be examined by an accepted imaging method and then imaged by a new method that is being evaluated greatly simplifies the quantitative analysis of the device being tested. In medical optical imaging, a substance called INTRALIPID™ has been widely used to simulate the optical absorption and scattering characteristics of breast tissue. While the use of a INTRALIPID™ as the filler media is of some use, the effects of the container are not controllable. Some researchers use a cylindrical container while other use square or rectangular containers, but none of these configurations resembles an in vivo breast.

A phantom that emulated the optical characteristics of breast tissue, that resembled the breast in shape and size, and that could be scanned by another modality to verify its make up would be of considerable value. The phantom construction technique described herein enables replication of the phantom using routine manufacturing techniques.

OBJECTS AND SUMMARY OF THE INVENTION

It is an object of the present invention to provide a phantom that emulates the optical characteristics of breast tissue, that resembled the breast in shape and size, and that could be scanned by another modality to verify its make up.

It is another object of the present invention to provide a phantom that can be used to evaluate a medical imaging device without the necessity of in vivo scanning.

It is still another object of the present invention to provide a breast phantom that permits objective rather than subjective analysis and is sensitive to small changes in medical optical image quality, to permit the use of the phantom as an integral component of a quality assurance protocol to verify the performance of a medical imaging apparatus being evaluated.

It is another object of the present invention to provide a breast phantom that may be scanned by a magnetic resonance imaging apparatus to generate slice-plane images for direct comparison with those generated by an optical imaging apparatus under evaluation.

It is an object of the present invention to provide a breast phantom having optical characteristics of absorption and scattering that are tissue equivalent to breast tissue.

It is still another object of the present invention to provide a breast phantom that can be replicated by standard manufacturing techniques.

It is still another object of the present invention to provide a breast phantom that is stable over time and whose optical characteristics would not change.

In summary, the present invention provides a breast-shaped phantom for optical imaging comprising a cup in the shape of a human breast in its natural pendant position and a filler occupying the volume of the cup. The cup forms an outer skin of the phantom with a thickness similar to human skin and with optical transparency at selected optical wavelengths similar to human skin. The filler material has optical scattering and absorption characteristics similar to human breast tissue.

The present invention also provides a method for making breast-shaped phantom for optical imaging, comprising the steps of molding a cup in the shape of a breast in a pendant position hanging freely and transversely from the body to form an outer skin of the breast-shaped phantom, the cup having an optical transparency at selected wavelengths similar to human skin; and filling the cup with a filler material with optical scattering and absorption characteristics similar to human breast tissue.

These and other objects of the present invention will become apparent from the following detailed description.

BRIEF DESCRIPTIONS OF THE DRAWINGS

DETAILED DESCRIPTION OF THE INVENTION

Figure 1:
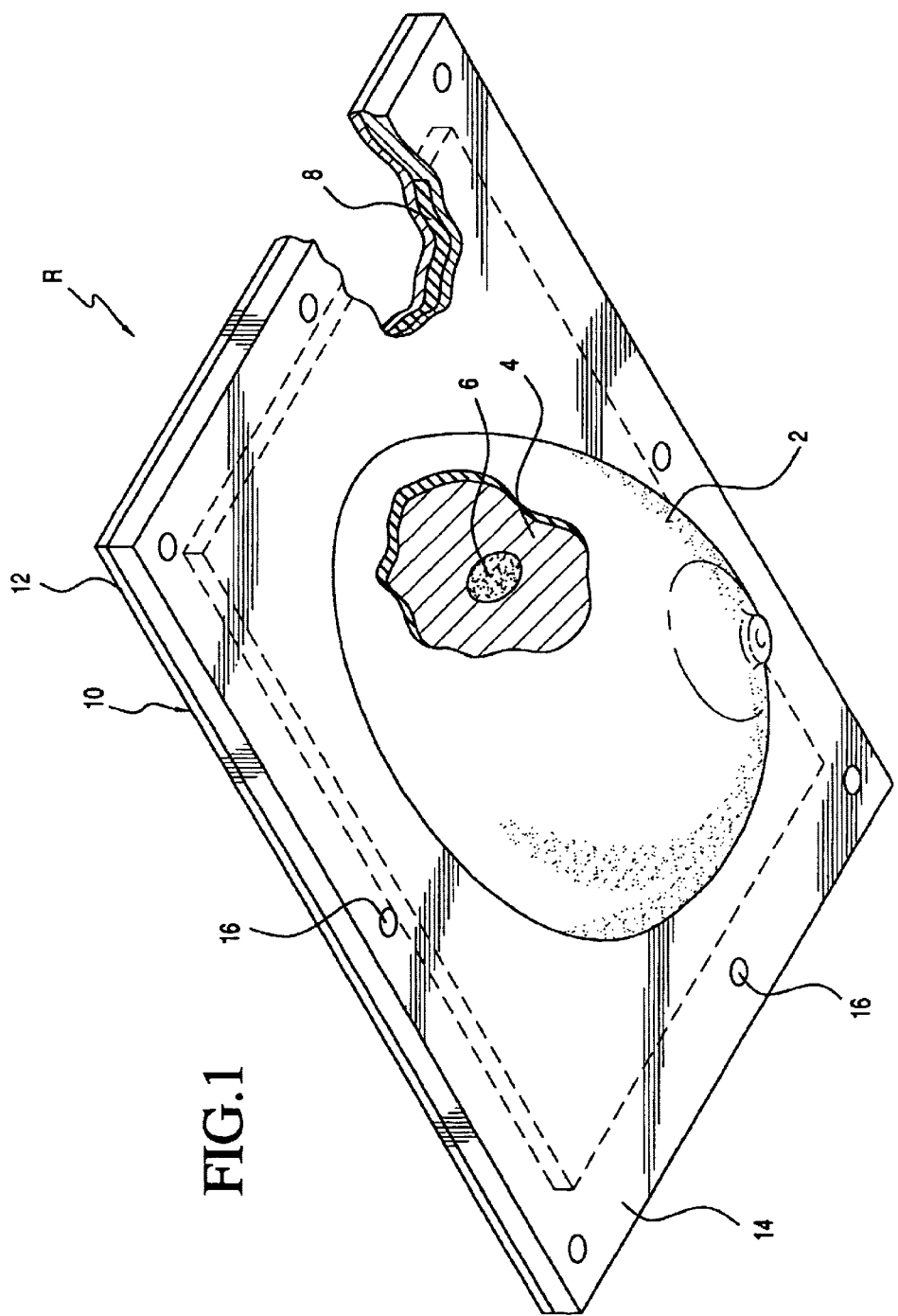
FIG. 1 is a bottom perspective view, with portions broken out, showing a breast-shaped phantom made in accordance with the present invention.

A breast phantom R made in accordance with the present invention is disclosed in FIG. 1. The phantom R includes an outer skin 2 having a thickness similar to that of human skin. The outer skin 2 is molded into an anatomically accurately shaped breast of various sizes and shapes as encountered in the female population. The outer skin 2, which forms a cup 3, is filled with a filler 4 made a mixture of water and agar. Agar is a polysaccharide found in the cell walls of some red algae and is unusual in containing sulfated galactoses monomers. Agar is preferable since it is a carbohydrate derivative and is thus unaffected by proteinases. Agar will retain its gelled characteristics at room temperature while gelatin turns to soup. Agar has been shown to be useful as a phantom media for magnetic resonance imaging and the phantoms are physically stable at room temperature. Agar acts as a framework that holds the filler 4 together.

A standard preservative is added to the agar mixture to prevent bacterial growth. A scattering-inducing component is also added to the filler mixture to introduce the desired optical scattering characteristics to simulate human breast tissue. The scattering material can be 0.5% INTRALIPID™ titanium dioxide or other scattering materials. INTRALIPID™ fat emulsion is a product of Phamacia-Upjohn and is distributed by VWR Scientific Products (part no. 68000-400, 490-15 INTRALIPID™ CL RM 500 ml, 10% solution). A plurality of bolus 6 to simulate lesions of large and small size with absorptive and increased scattering optical characteristics, and positioned both deep inside or near surface of the phantom R are included. A cystic lesion is a collection of a number of pockets of lipids, which makes it less light scattering. A tumor is light absorbing since it would have greater number of blood vessels than a benign lesion. The bolus material may be made from olive oil mixed with an absorbing dye to simulate absorbing lesions. Increased or decreased concentrations of INTRALIPID™ mixed with distilled water have the characteristic of increased or decreased local scattering. Olive oil alone appears as a cysteic lesion. The volume of the bolus 6 determines the size of the simulated lesion and the material used controls the optical characteristic of increased absorption, increased or decreased scattering, or cysteic nature of the simulated lesion.

The filler 4 and bolus 6 are advantageously suitable for magnetic resonance imaging. Images generated by a MRI device is an accepted standard against which to compare images generated by an optical imaging device under evaluation. Thus, the ability of the phantom R to be imaged by both the standard MRI device and the optical imaging device under consideration is very important.

The outer skin 2 includes a peripheral flange portion 8, which is secured to a non-metallic mounting assembly 10, including a top plate 12 secured to a bottom plate 14 with non-metallic screws 16. The bottom plate 14 has an opening through which the phantom R protrudes. The flange portion 8 is sandwiched between the top and bottom plates 12 and 14.

The phantom R is an anatomically shaped female breast without compression as it is seen by a scanner as the breast hangs pendent into a scanning chamber beneath a table on which a patient lies face down. U.S. Pat. No. 5,692,511 discloses an optical imaging apparatus in which the phantom R may be used.

Figure 2:
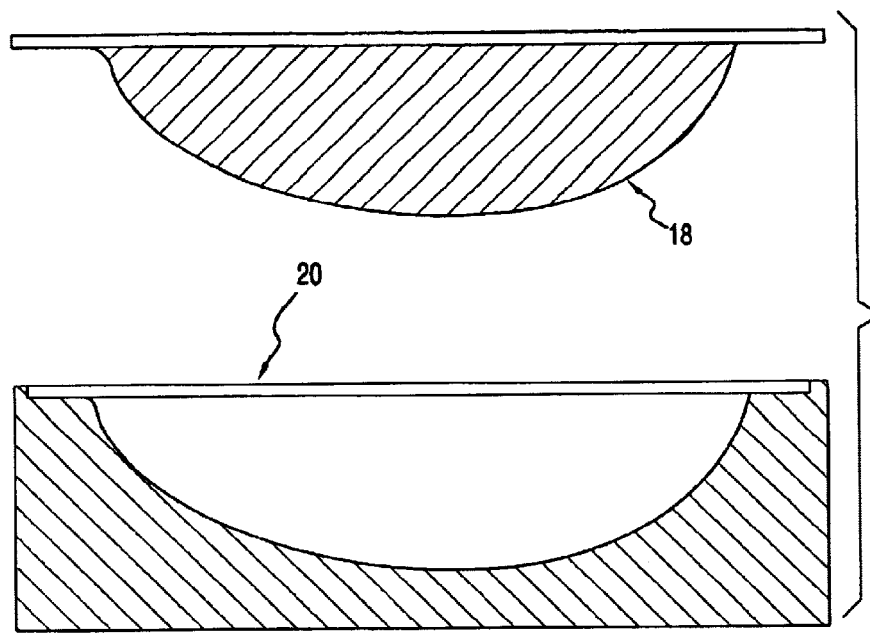
FIG. 2 is a cross-sectional view of male and female molds for use in making the breast phantom of the present invention.
Figure 3:
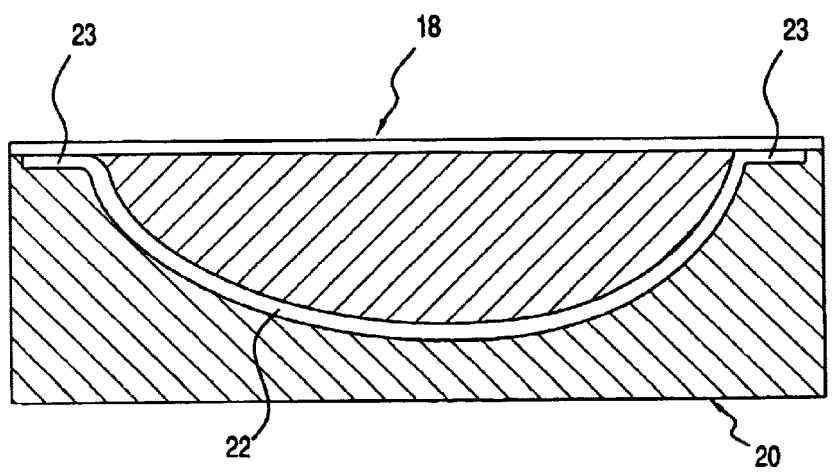
FIG. 3 is cross-sectional view showing a spacing or gap between the male and female molds when assembled together.

A process for making the phantom R in accordance with the present invention will now be described. Male and female molds 18 and 20 of the female breast are provided as best shown in FIG. 2. The male mold 18 is sized such that a uniform gap 22 is formed between the surfaces of the molds. The thickness of the gap 22 is on the order of 2 mm, which is typical for breast skin.

Figure 4:
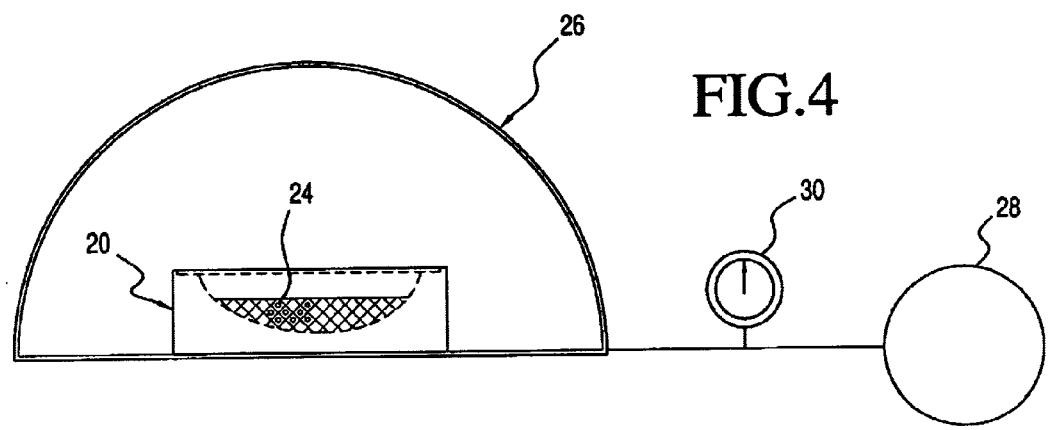
FIG. 4 is a schematic view of a vacuum chamber for use in drawing out bubbles from a polyurethane material used for molding the outer skin of the breast phantom of FIG. 1.
Figure 5:
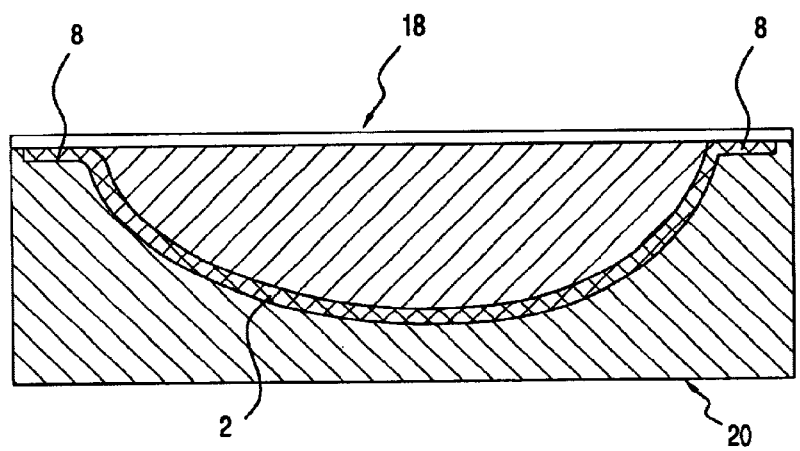
FIG. 5 is a cross-sectional view of the male and female molds assembled together, showing the polyurethane material filling in the gap between the mold surfaces.
Figure 8:
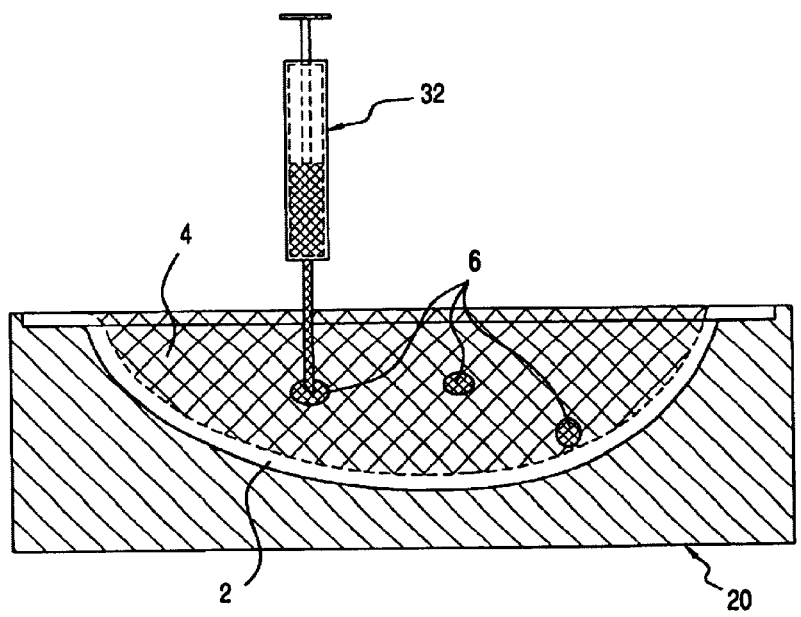
FIG. 8 is a side cross-sectional view similar to FIG. 7B, showing the use of a syringe to introduce at a known location a bolus to simulate a lesion within the phantom.

The material used for the outer skin 2 is preferably of high tensile strength to allow supporting the filler material 4 while being mounted to the mounting assembly 10. The material for the outer skin 2 advantageously has optical characteristics similar to human skin at similar thickness. Amber color polyurethane has been found to have the required characteristics for the outer skin 2. The polyurethane material is supplied in two parts that are mixed together and maintains a viscous characteristic for a period of time to permit working with the mixed material. Since the mixing process introduces air bubbles into the mixture, the trapped air bubbles 24 must be removed. The viscous polyurethane mixture is poured into the female mold 20 and placed in a vacuum chamber 26, as best shown in FIG. 4. A vacuum pump 28 slowly draws vacuum from the chamber 26, causing the air bubbles 24 to leave the viscous polyurethane mixture. A vacuum gage 30 is used to monitor the vacuum. The vacuum is slowly released and the vacuum chamber 26 is opened. The male mold 18 is then carefully lowered into the viscous polyurethane mixture to force the material into the gap 22 between the male and the female molds. The excess material flows into the flange cavity 23 to form the flange portion 8, as best shown in FIG. 5.

Figure 6A:
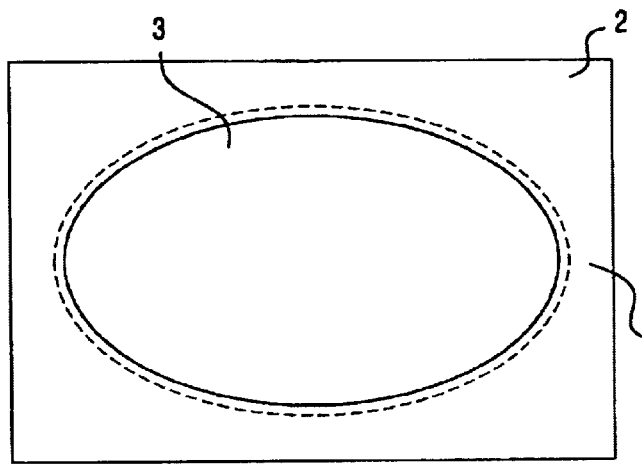
FIGS. 6A and 6B are top and side views of the completed molded skin formed from the molds.
Figure 6B:
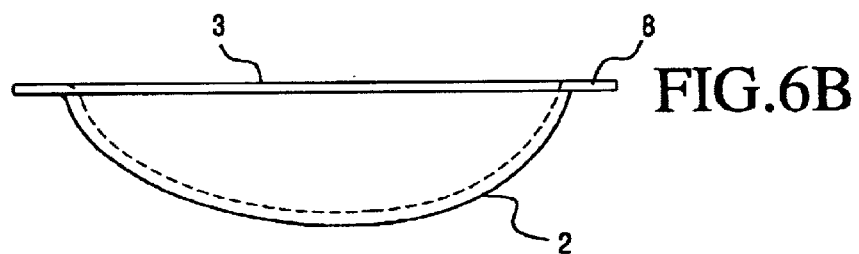
Figure 7A:
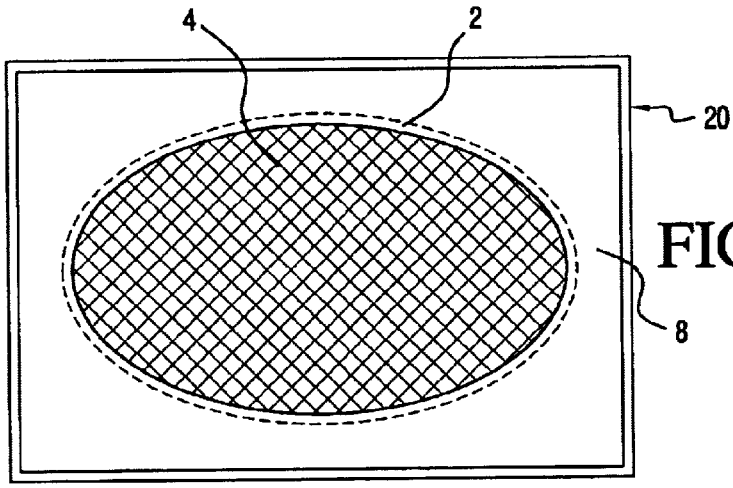
FIGS. 7A and 7B are top and side cross-sectional views of the female mold supporting the formed outer skin filled with a filler.
Figure 7B:
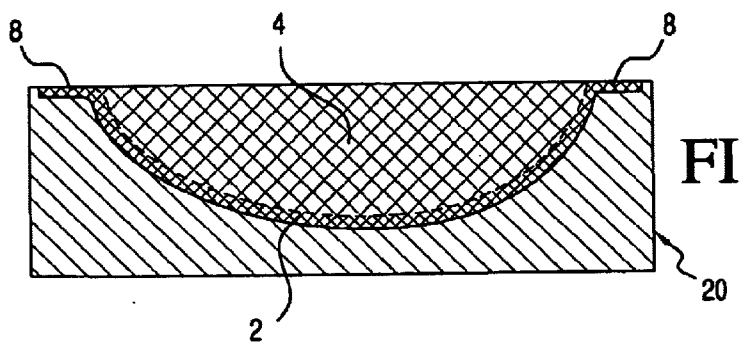

The finished molded outer skin 2 is disclosed in FIGS. 6A and 6B. It includes the cup 3 and the flange portion 8. The molded outer skin 2 has anatomically correct features without compression to act as the outside skin of the phantom R.

The male mold 18 is removed after the polyurethane has been allowed to cure, leaving the molded skin 2 on the female mold 20. The filler material 4 is then poured into the outer skin 2 to fill up the volume of the cup 3. The filler 4 is prepared by mixing a measured amount of distilled water and agar powder. Other materials may be mixed in with the mixture as described above. The mixture is heated to a boil and boiled for about 15 minutes. The mixture is then carefully poured into the molded skin 2. The liquid is allowed to slowly cool. When the mixture has cooled sufficiently, a syringe 32 is used to introduce bolus 6 to simulate a lesion at a known position in the solidifying mixture. The bolus 6 to simulate a lesion is made from a mixture of olive oil and absorptive dye, or a mixture of distilled water and INTRALIPID™. The bolus 6 may also simulate a cystic lesion and is made from a mixture of distilled water and INTRALIPID™ or a mixture of olive oil and absorptive dye.

EXAMPLE

To make 700 ml of mixture for the filler 4, the following ingredients are provided.

700 ml of distilled water 1 teaspoon of winemaker's potassium metabisulfate (bactericide)

1 teaspoon of winemaker's potassium sorbate (antioxidant/preservative)

10.5 g granulated agar 37.18 ml of Intralipid (10%)

The water is brought to a boil and agar is mixed in. The water is stirred to dissolve the agar in the water. The mixture is then allowed to cool slightly above room temperature. Potassium metabisulfate, potassium sorbate, and INTRALIPID™ are then added. The mixture is poured into the cup 3 and allowed to cool. The agar mixture will set up like gelatin.

The phantom R made in accordance with the example exhibits an absorption coefficient, $\mu_s$ of approximately 0.008 mm$^{-1}$ and a transport scattering coefficient, $\mu_s$ of approximately 1.0 mm$^{-1}$.

The phantom R is preferably operated between 790–810 nm wavelength, since at these wavelengths the effect of skin pigmentation is minimized.

While other shapes could be used for the phantom, the anatomically correct configuration allows easy comparison of phantom images with in vivo images using a medical optical image device being tested and a standard MRI device. Having an anatomically accurately shaped phantom is important for quality control purposes. A cylindrical phantom will reflect light differently within the scanning chamber than a breast shaped one, since light is only looking at a vertical surface laterally and vertically, while reflection from a breast shaped phantom would change as the scanner goes around it horizontally and vertically. Further, since the diameter of a cylindrical phantom is constant, while the breast shaped phantom is constantly changing at each vertical location of the scanner with respect to the breast, including its perimeter profile, a cylindrical phantom cannot simulate the myriad of perimeter shapes that an anatomically shaped breast phantom could present to the scanner. Perimeter determination is crucial to image reconstruction in an optical imaging device.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

We claim:

1. A breast-shaped phantom for imaging by both a standard magnetic resonance imaging (MRI) device and an optical imaging device, which is evaluated using images of the phantom made by the MRI device and the optical imaging device, comprising:
   a) a cup in the shape of a female breast in its natural pendant position when the female is positioned prone face down with her breast hanging freely, said cup for forming an outer skin of said phantom having a thickness similar to human skin and having optical transparency at selected optical wavelengths similar to human skin, said cup having an internal volume;
   b) a filler material occupying the volume of said cup, said filler material having an optical scattering and absorption characteristics to simulate a human breast tissue when imaged by the optical imaging device; and
   c) said filler material being detectable by magnetic resonance imaging thereby to create a MRI image as a standard for comparison with an image generated by the optical imaging device under evaluation.

2. A breast-shaped phantom as in claim 1, and further comprising:
   a) a preservative mixed within said filler to prevent bacteriological growth within said filler.

3. A breast-shaped phantom as in claim 1, and further comprising:
   a) a bolus disposed within said filler in a known location and having increased or decreased scattering characteristics to selected optical wavelengths.

4. A breast-shaped phantom as in claim 1, and further comprising:
   a) a bolus disposed within said filler in a known location and having increased or decreased absorption characteristics to selected optical wavelengths.

5. A breast-shaped phantom as in claim 1, and further comprising:
   a) a plurality of bolus having different optical characteristics disposed within said filler at known locations.

6. A breast-shaped phantom as in claim 5, wherein:
   a) said bolus includes olive oil.

7. A breast-shaped phantom as in claim 5, wherein:
   a) said bolus includes an absorbing dye.

8. A breast-shaped phantom as in claim 1, and further comprising:
   a) a mounting flange operatively secured to said phantom.

9. A breast-shaped phantom as in claim 1, wherein:
   a) said outer skin is made of polyurethane material.

10. A breast-shaped phantom as in claim 1, wherein:
    a) said filler includes agar.

11. A breast-shaped phantom as in claim 1, wherein:
    a) said filler includes fat emulsion.

12. A breast-shaped phantom for imaging by both a standard magnetic resonance imaging (MRI) device and an optical imaging device, which is evaluated using images of the phantom made by the MRI device and the optical imaging device, comprising:
    a) a cup for forming an outer skin of said phantom having a thickness similar to human skin and having optical transparency at selected optical wavelengths similar to human skin made of polyurethane material, said cup having an outer shape similar to female breast in its natural pendant position when the female is positioned prone face down with her breast hanging freely;
    b) a filler material including agar occupying the internal volume of said cup;
    c) compounds mixed in with said filler material to modify the optical scattering and absorbing characteristics of said filler material to simulate human breast tissue when imaged by the optical imaging device; and
    d) said filler material and said compounds are detectable by magnetic resonance imaging thereby to create a MRI image as a standard for comparison with an image generated by the optical imaging device under evaluation.

13. A breast-shaped phantom as in claim 12, wherein:
    a) said filler includes fat emulsion.

14. A phantom as in claim 12, wherein:
    a) said compounds include titanium dioxide.

15. A phantom as in claim 12, wherein:
    a) a bolus disposed within said filler in a known location and having increased or decreased absorption characteristics.

16. A phantom as in claim 12, wherein:
    a) a bolus disposed within said filler in a known location and having increased or decreased scattering characteristics.

17. A phantom as in claim 12, and further comprising:
    a) a preservative mixed within said filler to prevent bacteriological growth within said filler.

18. A breast-shaped phantom as in claim 12, and further comprising:
    a) a mounting flange operatively secured to said phantom.

* * * * *